(12) United States Patent
Sugawara et al.

(10) Patent No.: US 6,600,192 B1
(45) Date of Patent: Jul. 29, 2003

(54) VERTICAL FIELD-EFFECT SEMICONDUCTOR DEVICE WITH BURIED GATE REGION

(75) Inventors: Yoshitaka Sugawara, Higashiosaka (JP); Katsunori Asano, Nara (JP)

(73) Assignee: The Kansai Electric Power Co., Inc., Osaka (JP)

( * ) Notice: Subject to any disclaimer, the term of this patent is extended or adjusted under 35 U.S.C. 154(b) by 0 days.

(21) Appl. No.: 09/806,874

(22) PCT Filed: Oct. 7, 1999

(86) PCT No.: PCT/JP99/05551

§ 371 (c)(1),
(2), (4) Date: Apr. 5, 2001

(87) PCT Pub. No.: WO00/22679

PCT Pub. Date: Apr. 20, 2000

(30) Foreign Application Priority Data

Oct. 9, 1998 (JP) ............................................ 10-288402

(51) Int. Cl.[7] .............................................. H01L 29/76
(52) U.S. Cl. ......................... 257/329; 257/77; 438/268
(58) Field of Search ......................... 257/77, 329, 339; 438/931, 268

(56) References Cited

U.S. PATENT DOCUMENTS

| 5,554,561 | A | | 9/1996 | Plumton | |
|---|---|---|---|---|---|
| 5,610,085 | A | | 3/1997 | Yuan et al. | |
| 5,747,842 | A | | 5/1998 | Plumton | |
| 5,912,497 | A | * | 6/1999 | Baliga | 257/139 |
| 6,146,926 | A | * | 11/2000 | Bhatnagar et al. | 438/140 |
| 6,281,521 | B1 | * | 8/2001 | Singh | 257/200 |

FOREIGN PATENT DOCUMENTS

| CN | 1112731 A | 11/1995 |
|---|---|---|
| EP | 0 656 646 A1 | 11/1995 |
| JP | 52-95984 | 8/1977 |
| JP | 57-172765 A | 10/1982 |
| JP | 7-326754 A | 12/1995 |

OTHER PUBLICATIONS

Tan et al., High–Voltage Accumulation–Layer UMOFET's in 4H–SiC, IEEE Elec. Device Lett., 19 (Dec. 1998) 487.*
Linewih et al., Novel SiC Accumulation–Mode Power MOSFET, IEEE Trans. Elec. Devices, 48 (Aug. 2001) 1711.*
Shenoy et al., The Planar 6H–SC ACCUFET: A New High–Voltage Power MOSFET Structure, IEEE Elec. Device Lett., 18 (Dec. 1997) 589.*
Chilukuri et al., High Temperature Operation of SiC Planar ACCUFET, IEEE, 1998, 954.*
Agarwal et al., SiC Electronics, Technical Digest, IEDM 96, pp. 225–230, (1996).
Weitzel et al., Silicon Carbide High–Power Devices, IEEE Transactions On Electron Devices, vol. 43, No. 10, pp. 1732–1741, (1996).
Agarwal et al., 1.1 kV 4H–SiC Power UMOSFET's IEEE Electron Device Letter, vol. 18, No. 12, (1997).

* cited by examiner

*Primary Examiner*—Vu A. Le
*Assistant Examiner*—Christian D. Wilson
(74) *Attorney, Agent, or Firm*—Akin, Gump, Strauss, Hauer & Feld, L.L.P.

(57) ABSTRACT

A buried gate region, a buried gate contact region and a gate contact region are provided on an SiC substrate. Thereby, a depletion layer expands in the channel region, and a high withstand voltage is attained in the normally off state. By applying a voltage of the built-in voltage or less to a gate, the depletion layer in the channel region becomes narrower and an ON-state resistance becomes low. Furthermore, when a voltage of the built-in voltage or more is applied to the gate, holes are injected from the gate so as to cause the conductivity modulation, and the ON-state resistance becomes further low.

13 Claims, 9 Drawing Sheets

F I G. 2
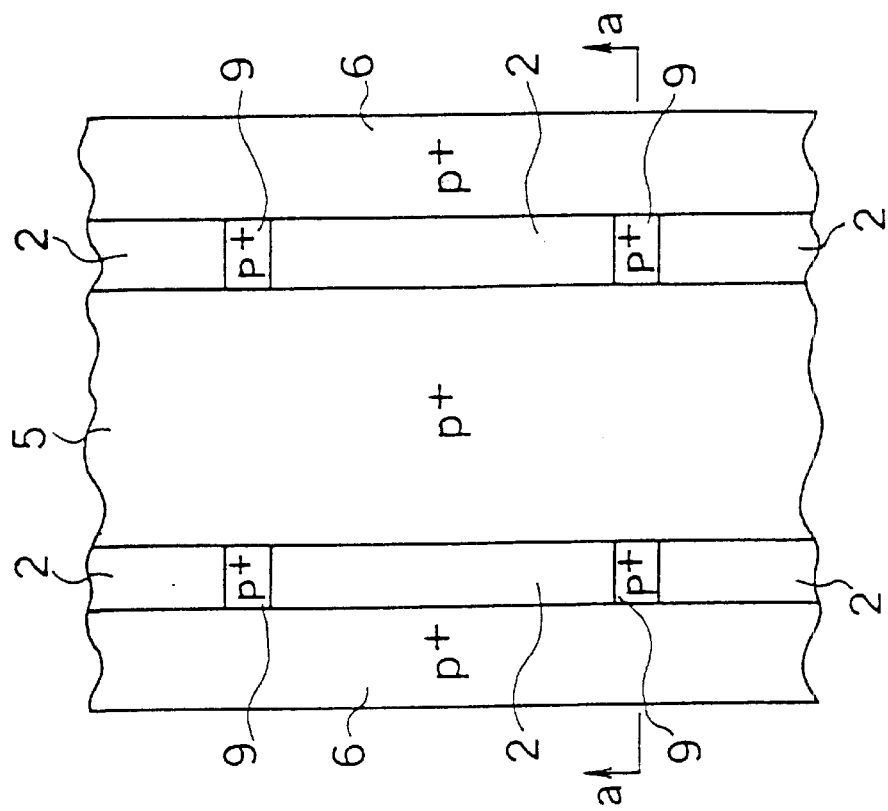
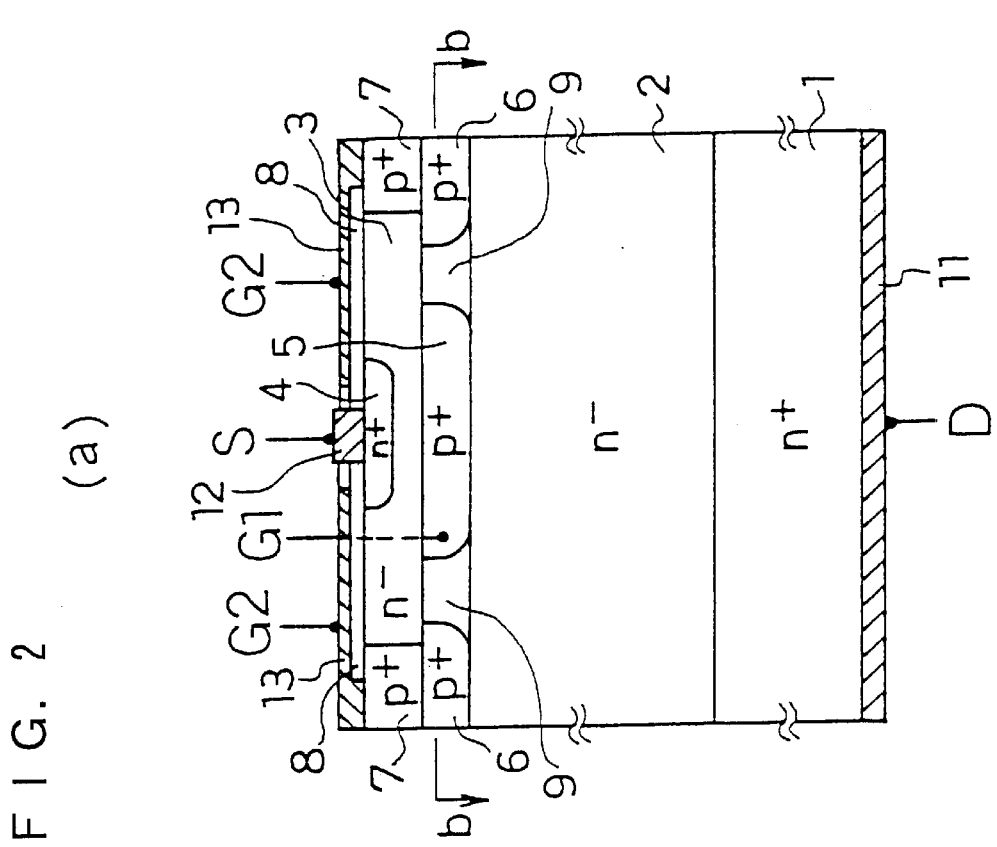

PRIOR ART

PRIOR ART

VERTICAL FIELD-EFFECT SEMICONDUCTOR DEVICE WITH BURIED GATE REGION

TECHNICAL FIELD

The present invention relates to an improvement of a field effect semiconductor device.

BACKGROUND ART

As a vertical type power semiconductor device having a small input loss, being excellent in high speed switching characteristics, and having a high input impedance, for example, a Metal Oxide Semiconductor Field Effect Transistor (MOSFET) is known. FIG. 8 is a cross-sectional view of a trench gate type MOSFET of a prior art. In this trench gate type MOSFET of the prior art, by employing a trench type structure forming a gate 106 in a recess 110, an efficient utilization of the surface area is intended; and it is intended to reduce power loss. Recently, a power semiconductor device using a single crystal material of silicon carbide (SiC) has been produced by way of trial; and as for the trench gate type MOSFET of FIG. 8, an n-type drift layer 102 is formed on a semiconductor substrate 101 of an n-type silicon carbide by epitaxial method. A p-type body layer 103 is formed on the n-type drift layer 102, and in addition, an n-type source region 104 is formed in a predetermined region of the p-type body layer. The recesses 110 are formed at both the end parts of the n-type source region 104 and the p-type body layer 103 so as to reach the n-type drift layer 102, and gate electrodes 106 are formed via respective gate insulating films 105 formed on the surface of the recesses 110. A source electrode 108 is formed on the p-type body layer 103 and the n-type source regions 104. A drain electrode 107 is formed on the bottom surface of the n-type silicon carbide semiconductor substrate 101.

A voltage is applied to the gate electrode 1061 and an electric field is given to the gate insulating films 105 of the recess parts placed between the gate electrodes 106 and the p-type body layer 103 of the recess sidewall part, and thereby, the conductive type of the p-type body layer 103 which contacts the gate insulating film 105 is inverted to the n-type so as to form a channel which makes the carriers flow between the source S and the drain D.

FIG. 9 is a cross-sectional view of an ACCUFET (accumulation field effect transistor: see IEEE Electron Device Letters, vol. 18, No. 12, December 1997) which uses SiC according to another prior art. In the ACCUFET, a p+-type buried region 109 is formed by injecting ions into a drift layer 102. This buried region 109 is connected to a source region 104 with a connection wire 115 so as to be at the same potential as the source region 104, and thereby, an electric field at the lower part of the gate insulating film 105 is alleviated. By making the buried region 109 and the source region 104 identical in potential, a depletion layer expands in a channel part 111 due, to the existence of a built-in voltage of the junction, and without applying a gate voltage to the gate G, a normally off operation becomes possible, so as to interrupt a current between the drain,D and the source S, and in addition, it becomes advantageous to heighten a withstand voltage.

In the vertical type semiconductor device which has the trench structure of the trench gate type MOSFET, or the like, in FIG. 8, when it is intended to heighten a withstand voltage, electric field tends to concentrate at the bottom parts or at the corner parts of the trench 110, therefore, it is difficult to heighten the withstand voltage. Particularly in a semiconductor device using SiC, since the insulation breakdown electric field is high, the impurity density of the drift layer 102 can be made high so as to lower the resistance thereof. As a result, the electric field in the vicinity of the gate insulating film 105 at the bottom part of the trench 110 becomes higher and it is difficult to heighten the withstand voltage. In addition, though it is necessary to make the gate voltage high in order to implement a low ON-state resistance, when a high gate voltage is applied, the electric field in the vicinity of the gate insulating film 105 becomes high so as to lower the reliability of the device.

Moreover, in the vertical type semiconductor device which has the trench structure, because of the influence of the process for forming the trench 110, the interface state density which exists at the interface between the gate insulating film 105 and the drift layer 102 becomes large and the roughness of the interface becomes greater. Because of that influence, the mobility of the channel which is a current path in ON-state becomes small and, as a result, an ON-state resistance becomes large.

In an ACCUFET semiconductor device or the like, which does not have the trench structure of FIG. 9, since no trenches are formed, the interface state density is not large and, the influence of the roughness of the interface is small unlike in a semiconductor device of a trench structure. In addition, in the case that a high voltage is applied to the drain D at OFF-state, a depletion layer expands from the p+-buried region 109 to the side of the drain electrode 107, bringing the area between the buried region 109 and the drift layer into a pinch off state thereby to withstand a high voltage, and therefore, a high electric field is not applied to the gate insulating film 105. In order to maintain the normally OFF-state, that is to say, the OFF-state even when the drain voltage is 0 V in this structure, however, it is necessary to bring the channel region 111 into a pinch off state by means of a depletion layer formed by the built-in voltage in the junction part between the buried region 109 and the channel 111 located above. Therefore, the channel width of the channel region 111 has to be narrow. On the other hand, in order to realize a low ON-state resistance at the ON-state, the width of the channel needs to be made wider, and therefore, it is difficult to realize both the maintenance of the normally OFF-state and the low ON-state resistance at the ON-state.

DISCLOSURE OF THE INVENTION

The present invention purposes to provide a semiconductor device which alleviates the electric field at the lower parts of the gate insulating film 105, being low in an ON-state resistance, high in a withstand voltage and high in reliability.

In a semiconductor device of the present invention, a channel region of the first conductive type of a low impurity density comprising a source region of the first conductive type of a high impurity density is formed so as to contact, except for a portion of the bottom part thereof, a buried gate region, a buried gate contact region and a surface gate contact region of the second conductive type. In addition, it has the configuration wherein a gate electrode is provided so as to face said channel region between the source region of the first conductive type and the surface gate contact region of the second conductive type via an insulating film.

According to the configuration-, when a voltage equal to or below the built-in voltage of the junction is applied to the gate electrode at the ON-state, the depletion layer expanding into the above-mentioned channel region contracts into a narrow range of the channel region. Therefore, the channel width through which a current flows becomes wide so that a low ON-state resistance is realizable at a low gate voltage.

At the OFF-state, a depletion layer expands from the junction of the buried gate region as well as the buried gate contact region of the second conductive type and the drift layer, to the side of the drain so as to pinch off the area between both of the buried regions and support a voltage and, therefore, a high electric field is not applied to the gate insulating film and a semiconductor device of a high reliability is obtainable.

In addition, in an area between the buried gate region of the second conductive type and the buried gate contact region of the second conductive type, in order to maintain the ON-state resistance at a low value and to reduce the gate resistance, buried gate connection regions of the second conductive type are formed being spaced with predetermined intervals from each other. Thereby, the three regions of the second conductive type are electrically connected.

By this structure, the depletion layer expanding through the channel region can be made to contract to a narrow range, not only in the upward and downward directions but also in all directions, by applying a voltage equal to the built-in voltage and below to the gate. As a result, the channel width can be wide, and a low ON-state resistance is realizable even in a low gate voltage. In addition, the normally off condition can be easily implemented and a higher withstand voltage can be achieved.

In particular, since the gate is divided into a MOS insulated gate and a buried gate, respective gates can be controlled independently. When a voltage that is higher than that to the buried gate is applied to the MOS insulated gate, a further large storage effect of carriers can be attained so that the ON-state resistance can be further lowered.

In addition, by applying a voltage equal to the built-in voltage or higher to the gate, holes are injected to the channel region from the buried gate of the second conductive type so as to conductivity-modulate layer of the first conductive type, and the ON-state resistance can be further reduced.

In particular, the buried gate region of the second conductive type is formed through ion implantation of impurities having a low activation ratio, and the buried gate contact region of the second conductive type is formed by an ion implantation of impurities having a high activation ratio. Thereby, holes are injected from the buried gate contact region of the second conductive type, so that the conductivity modulation occurs effectively, and the ON-state resistance can be further lowered.

BRIEF DESCRIPTION OF THE DRAWINGS

FIG. 2(a) is a cross-sectional view showing a buried gate region of a field effect transistor according to a'second embodiment of the present invention;.

FIG. 2(b) is a cross-sectional view taken along line b—b of FIG. 2(a);

BEST MODE FOR CARRYING OUT THE INVENTION

Hereafter, preferred embodiments of the present invention are described with reference to FIG. 1 to FIG. 7. FIG. 1 to FIG. 7 respectively show one segment of a semiconductor device of each embodiment, and a number of these segments are connected in the right and left directions of the figure so as to form a semiconductor device of a large capacity. In each figure, the dimensions of each of the illustrated elements do not correspond to the actual dimensions.

FIRST EMBODIMENT

Figure 1:
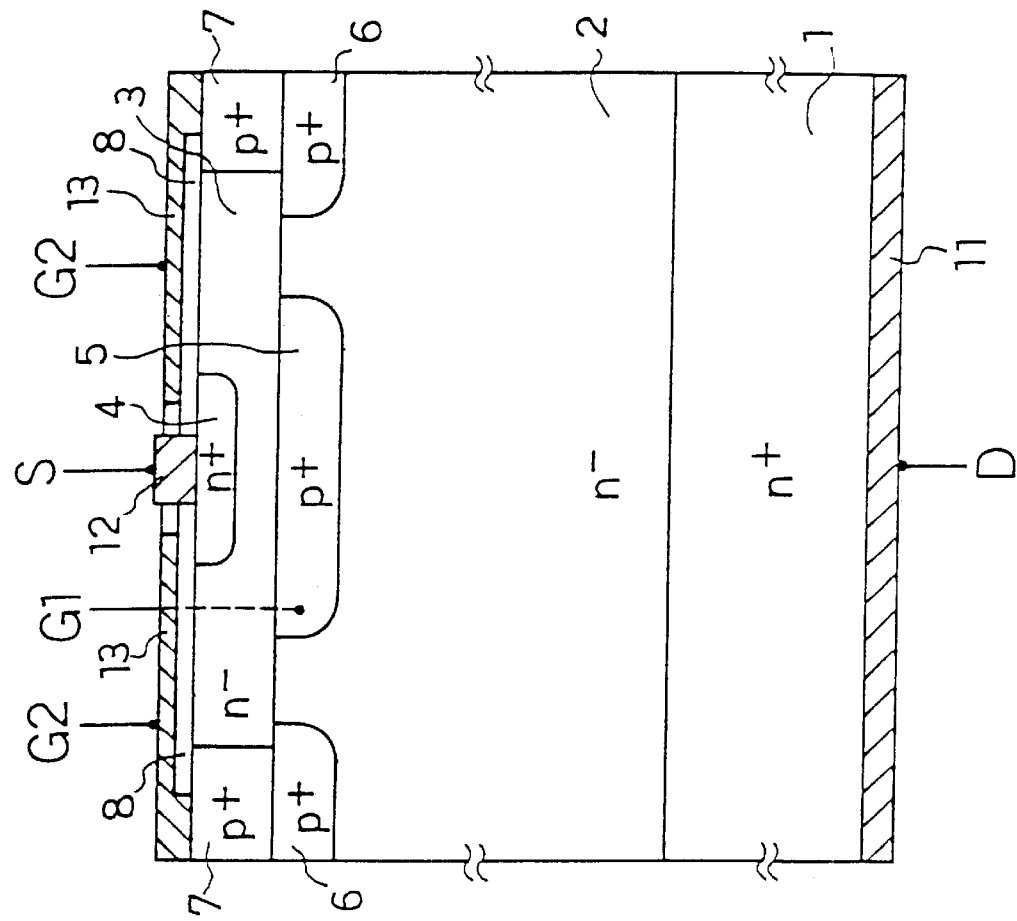
FIG. 1 is a cross-sectional view of a field effect transistor according to a first embodiment of the present invention.

FIG. 1 is a cross-sectional view of a segment of an SiC (silicon carbide) field effect transistor of 5 kV of withstand voltage according to the first embodiment of the present invention, and the segment has a stripe shape which is long in the direction vertical to the paper face. In FIG. 1, an n-type SiC drift layer 2 of a low impurity density of the thickness of approximately 60 $\mu$m is formed on an n-type SiC drain region 1 of a high impurity density of the thickness approximately 300 $\mu$m. An n-type SiC source region 4 which is-connected to the source electrode 12 is 0.2 $\mu$m in thickness, which may be approximately 0.1 $\mu$m to 0.3 $\mu$m. The thickness of the gate insulating film 8 is 0.10 $\mu$m. The optimal value of the thickness of the p+-type SiC buried gate region 5 is 0.3 $\mu$m. However, it may have the value of from 0.1 $\mu$m to 0.5 $\mu$m. The optimal thickness of an n-type channel region 3 is 0.3 $\mu$m. However, it may have the value of from 0.1 $\mu$m to 0.5 $\mu$m. The width of the p+-type buried gate region 5 is preferably longer than the n-type source region 4 by approximately 5 $\mu$m. However, it may be longer by the value of from 3 $\mu$m to 10 $\mu$m. The gap between the p+-type buried gate region 5 and the p+-type buried gate contact region 6 is optimal at the value of 3 $\mu$m. However, it may have the value of from 2 $\mu$m to 5 $\mu$m. In the present embodiment, the gate electrode 13 is in a stripe shape which is long in the direction vertical to the paper face. However, the form may be, for example, circular, rectangular, etc.

One example of a manufacturing process for the field effect transistor of the present embodiment is as follows. An n-type SiC substrate of a high impurity density of $10^{18}$ to $10^{20}$ atm/cm$^3$ which functions as the drain region 1 is provided and, on one of the surfaces thereof, an n-type SiC drift layer 2 of a low impurity density of $10^{14}$ to $10^{16}$ atm/cm$^3$ is formed by a chemical vapor deposition method, or the like. Next, a p+-type buried gate region 5 of approximately $10^{18}$ atm/cm$^3$ and a p+-type buried gate contact region 6 are formed by through an-ion implantation of aluminum, or the like, and, on top thereof, a channel region 3 of an n-type SiC drift layer of a low impurity density of $10^{14}$ to $10^{16}$ atm/cm$^3$ is formed again thereon by a chemical vapor deposition method, or the like. Subsequently, at both end parts of the channel region 3, a p+-type gate contact region 7 which reaches to the p+-type buried gate contact region 6 is formed by an ion implantation method of aluminum, or the like.

Next, an n-type source region 4 of a high impurity density of $10^{18}$ to $10^{20}$ atm/cm$^3$ is formed in the central part of the channel region 3 by an ion implantation method of nitrogen, or the like. After forming an insulating film 8 of SiO2 on the channel region 3, the n-type source region 4 and the p-type gate contact region 7, the SiO2 insulating film 8 is removed from both end parts of the p+-type gate contact region 7, and a gate electrode 13 which is connected to the p-type gate contact region 7 is formed by a metal film of Al, or the like. In addition, the SiO2 insulating film 8 on the central part of the n-type source region 4 is removed and a source electrode 12, which is connected to the n-type source region 4, is formed by a metal film such as aluminum or nickel. Furthermore, a portion of the buried gate region 5 is exposed at one position in the depth direction (in the direction vertical to the paperface of FIG. 1) of the segment, and an electrode G1 is connected to the exposed buried gate region 5 so as to be lead out to the side of the source electrode 12. Finally, a drain electrode 11, which is connected to the drain region 1, is formed by aluminum, nickel, or the like, and thereby resulting in completion.

In the SiC field effect transistor of the present embodiment, when the potentials between the gates G1, G2 and the source S is set to 0 V under the condition that the potential of the drain D is higher than the potential of the source S, a depletion layer corresponding to the built-in voltage expands from the junction part between the buried gate region 5 and the n-type drift layer 2 as well as the n-type channel region 3 which contact the buried gate region 5, and the channel region 3 can be made to a pinch off state. As a result, a current between the source S and the drain D can be cut off, and thereby resulting in a normally OFF-state. At this time, a depletion layer expands from the junction between the p+-type buried gate region 5 as well as the buried gate contact region 6 and the n-type drift layer 2 on the side of the drain D so as to bring the channel region 3 between the buried gate region 5 and the buried gate contact region 6 into the pinch off state. The depletion layer also expands to the side of the drain D, and since the depletion layer of this n-type drift layer 2 supports the voltage, a high electric field can be prevented from application to the gate insulating film 8, and thus a high reliability, is attainable. In addition, by applying a negative voltage to the gate G1, the channel region 3 can be in the pinch off state with a high drain voltage so that a withstand voltage can be heightened.

When a gate voltage is applied so that the potential of the drain D is higher than the potential of the source S and the potentials-of the gates G1, G2 are higher than the potential of the source S, the depletion layers in the channel region 3 and between the p+-type buried gate region 5 and the p+-type buried gate contact region 6 become narrow and the ON-state resistance reduces. The gate electrode 13 and the channel region 3 which faces the electrode 13 via the insulating film 8 form a MOS field effect element. Accordingly, in the above-mentioned voltage applied condition, the channel resistance of the channel region 3 is reduced owing to the storage effect of the carriers based on the field effect of the MOS, and the ON-state resistance is further reduced. When the gate voltage is further increased, the depletion layer becomes narrower and an increased number of electrons are stored in the channel region 3, and thereby the ON-state resistance is further reduced.

The withstand voltage of the field effect transistor of this embodiment is -approximately, 5.3 kV when the gates G1, G2 are set to 0 V, and the ON-state resistance is approximately 69 mΩcm$^2$ when the gate voltage is 2.5 V which is higher than the threshold voltage at which the MOS storage effect occurs. By applying –20 V to the gate. G1, the withstand voltage can be increased to 6 kV. In addition, by bringing the gate voltage into the built-in voltage (approximately 2.5 V for SiC) or less, only a current for the capacity of the depletion layer flows through the gates G1, G2, and the driving power can be suppressed to a low. In addition, in the case that the gate voltage is at the built-in voltage or more, holes are injected from the gates G1, G2, and thereby occurrence of the conductivity modulation is made possible by the injection of a small amount of holes. Thereby, a further low resistance, and therefore, a low ON-state voltage is realizable. In addition, the field effect transistor of the present embodiment does not include a trench, and a reactive ion etching process is not carried out for a trench process. Accordingly, there is little negative influence caused by a surface state or by the roughness of the interface, which would be a problem in the trench part of a field effect transistor having a trench structure.

SECOND EMBODIMENT

FIG. 2(a) is a cross-sectional view of a field effect transistor according to the second embodiment of the present invention, and FIG. 2(b) is a cross-sectional view taken along line b-b of FIG. 2(a) including a p+-type buried gate region 5 and a p+-type buried gate contact region 6. In the field effect transistor according to the first embodiment as shown in FIG. 1, the p+-type buried gate region 5 is connected to the gate terminal G1 at a predetermined position in the direction perpendicular to the paper face. Accordingly, at a position spaced apart from the gate terminal G1 in the buried region 5 which is long in the direction perpendicular to the paper face, the resistance (gate resistance) between the gate terminal G1 and the buried gate region 5 becomes high. The field effect transistor according to the second embodiment is provided with a plurality of p+-type buried gate connection regions 9 at constant intervals between the p-type buried gate region 5 and the p-type buried gate contact region 6 so as to make a connection therebetween. Except for this point, the structures of both embodiments are almost the same. By providing a plurality of buried gate connection regions 9, the p+-type buried gate region 5 and the p+-type buried gate contact region 6 are electrically connected at a plurality of positions. According to this configuration, the buried gate region 5 is connected to the gate G2 via the buried gate contact regions 6 and the p+-type gate contact regions 7 at constant intervals, and thereby, the gate resistance of the p-type buried gate region 5 can be greatly reduced. For example, in the case .that p+-type buried gate connection regions 9 are provided in an element of the length of 1 mm at intervals of 100 μm, the gate resistance can be reduced to approximately one tenth without hardly increasing the ON-state resistance.

In addition, in this structure, by applying a voltage of the built-in voltage or less of the p+ n-junction to the gate G2 so that the depletion layer which expands to the channel region 3 is made narrower not only in the upward and downward directions but also in the right and left directions, the channel width can be made broader, so that a low ON-state resistance can be attained at a low gate voltage. A normally OFF condition can also be easily realizable.

THIRD EMBODIMENT

Figure 3:
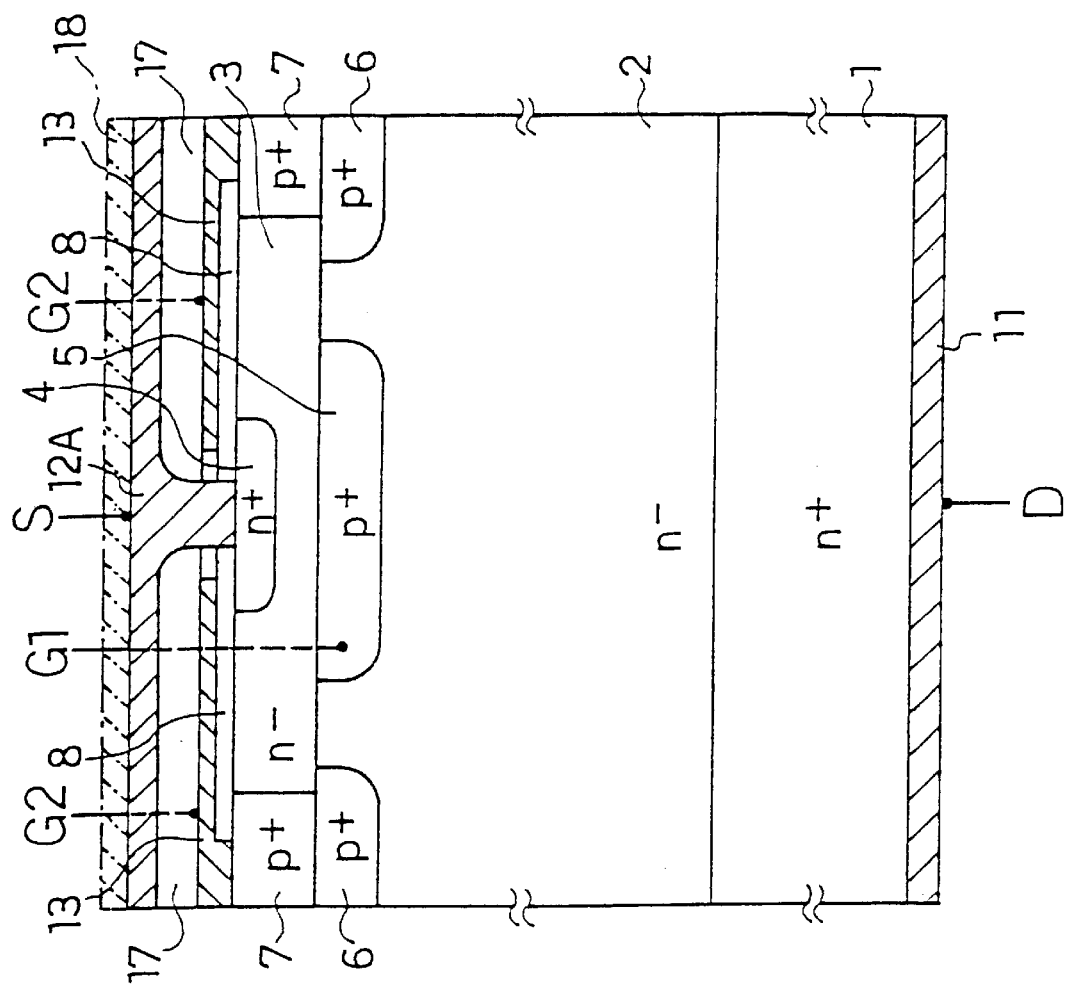
FIG. 3 is a cross-sectional view of a field effect transistor according to a third embodiment of the present invention.

FIG. 3 is a cross-sectional view of a segment of an SiC field effect transistor according to the third embodiment of the present invention. In the present embodiment, an insulating film 17 is formed on the entire surface of the gate electrode 13 and a source electrode 12A is formed on the entire surface of the insulating film 17. The configuration is the same as that of the first embodiment except for the point that the above-mentioned source electrode 12A is provided on the gate electrode 13 via the insulating film 17, and therefore, the overlapped descriptions are omitted. In the configuration of FIG. 3, the area of the source electrode 12A becomes large so that the resistance thereof can be greatly reduced. In the present embodiment, a source terminal S may be connected to the source electrode 12A by wire bonding, or a source terminal plate 18 of a flat plate shape may be formed by press-pack on the face of the source electrode 12A. In this manner, the stress caused by the pressure applied to the gate part including the gate electrode 13 is alleviated and a high reliability is attainable.

FOURTH EMBODIMENT

Figure 4:
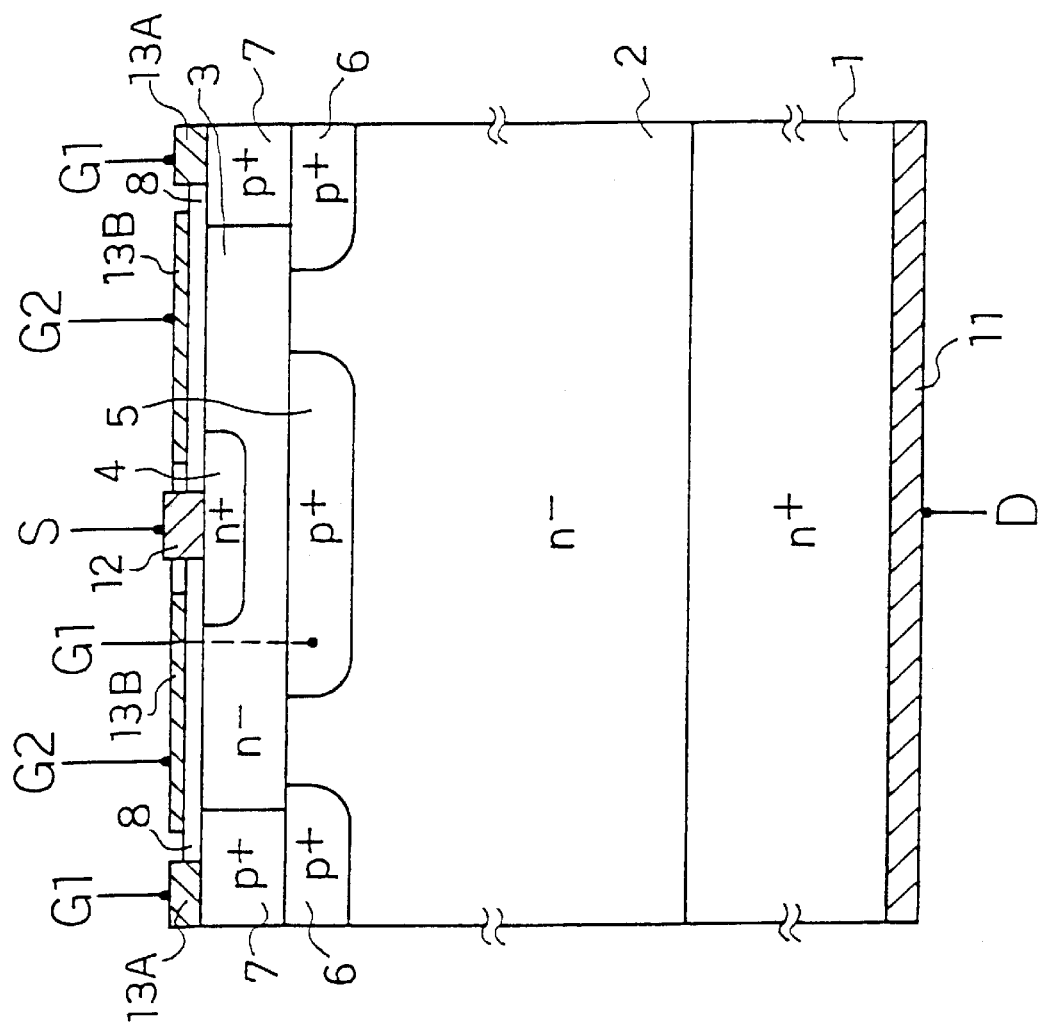
FIG. 4 is a cross-sectional view of a field effect transistor according to a fourth embodiment of the present invention.

FIG. 4 is a cross-sectional view of a segment of an SiC field effect transistor according to the fourth embodiment of the present invention. In the present embodiment, a gate electrode 13A is formed on a p-type gate contact region 7, and a MOS gate 13B of another gate electrode is formed on the gate insulating film 8. Other configurations are the same as those in the first embodiment as shown in FIG. 1, and therefore, the overlapped descriptions are omitted. By dividing the gate electrode into the gate electrode 13A and the MOS gate 13B, gate voltages different from each other can be applied to the gate electrode 13A and the MOS gate 13B; and thereby, the drift layer 2 adjacent to the buried gate contact region 6 and the buried gate region 5, and the channel region 3 which opposes to the MOS gate 13B via the insulating film 8 can be independently controlled. Consequently, at the time of turning on, by applying a voltage which is larger than that applied to the gate electrode 13A connected to the buried gate contact region 6 to the MOS gate 13B, the storage effect of the carriers in the MOS structure becomes larger so that the,ON-state resistance can be further reduced. For example, in a field effect transistor of 5.3 kV withstand voltage, when 5 V is applied to the MOS gate 13B and 2.5 V is applied to the gate electrode 13A, the ON-state resistance becomes 54 m Ωcm² which is reduced by approximately 20% in comparison with the case where 2.5 V is applied to the MOS gate 13B. When the voltage of the gate electrode 13A is further raised, holes are injected to the channel region 3 from the buried gate region 5, the buried gate contact region 6 and the gate contact region 7 so that the conductivity modulation occurs, and the ON-state resistance further reduces, and can be made to 18 mΩcm². In addition, by applying a voltage of −20 V to the gate electrode 13A, the channel region 3 can be pinched off even in the case that the drain voltage is high, and thereby, the withstand voltage is heightened and a high withstand voltage of 6 kV has been realized.

FIFTH EMBODIMENT

Figure 5:
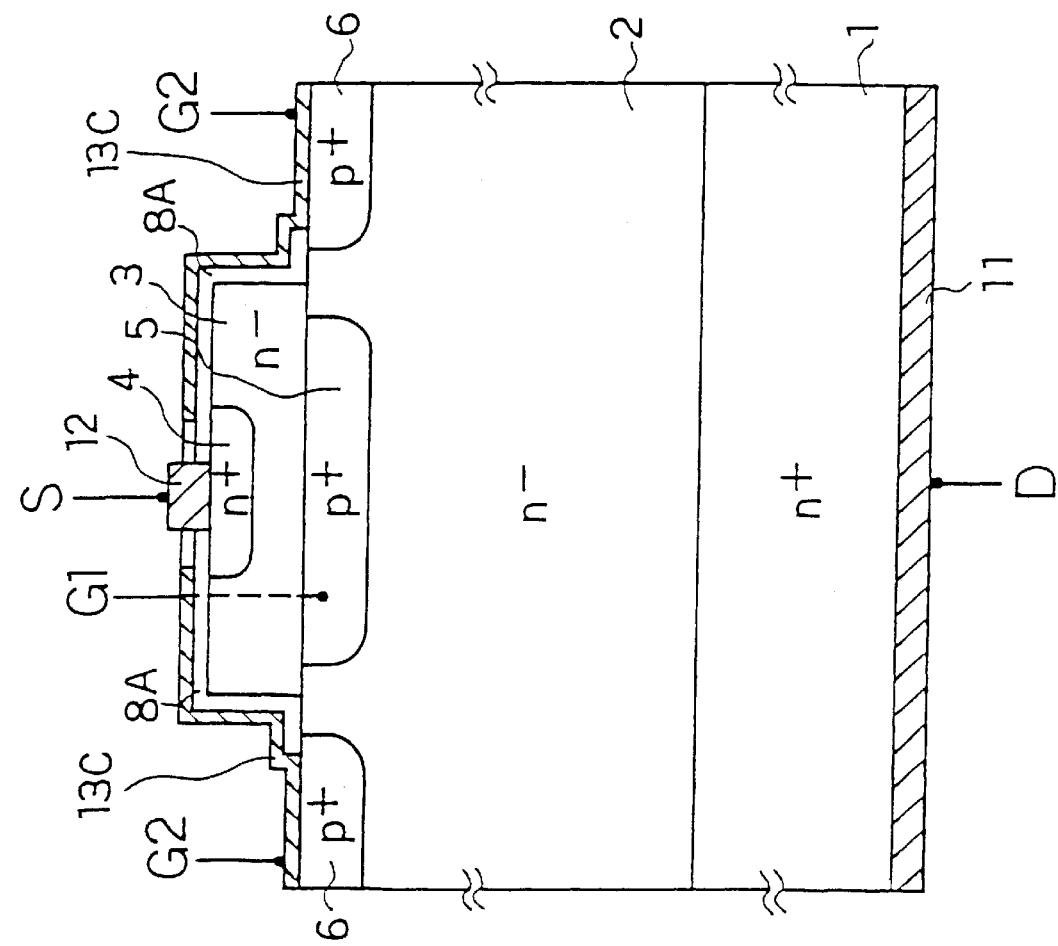
FIG. 5 is a cross-sectional view of a field effect transistor according to a fifth embodiment of the present invention.

FIG. 5 is a cross-sectional view of a segment of an SiC field effect transistor according to the fifth embodiment of the present invention. In the present embodiment, steps are provided on both end parts of the 4 segment of a field effect transistor so as to form a trench structure. Since the trench structure is employed, the channel region 3 results in a shape protruding from the n-type drift layer 2. A gate electrode 13C is formed on the top face and the side face of the channel region 3 via an insulating film 8A. Both end parts of the gate electrode 13C contact the buried gate contact region 6. Other configurations are the same as those of Embodiment 1 as shown in FIG. 1, and therefore, the overlapped descriptions are omitted. When a positive voltage is applied to the gate electrode 13C, the storage effect of the carries occurs on both sidewalls of the channel region 3, and the region in which the carriers are stored can be made to extend to an area between the p-type buried gate contact region 6 and the p-type buried gate region 5. Thereby, the further reduction of the On-state resistance can be intended. In the case of a field effect transistor element of 5.3 kV of withstand voltage, the ON-state resistance can be made to 61 mΩcm²

Incidentally, though both of the sidewalls are located between the buried gate region 5 and the buried gate contact region 6 in this structure, they may be located above the buried gate contact region 6. Thereby, the withstand voltage is slightly lowered, but the current path becomes wider so that the ON-state resistance can be further reduced.

SIXTH EMBODIMENT

Figure 6:
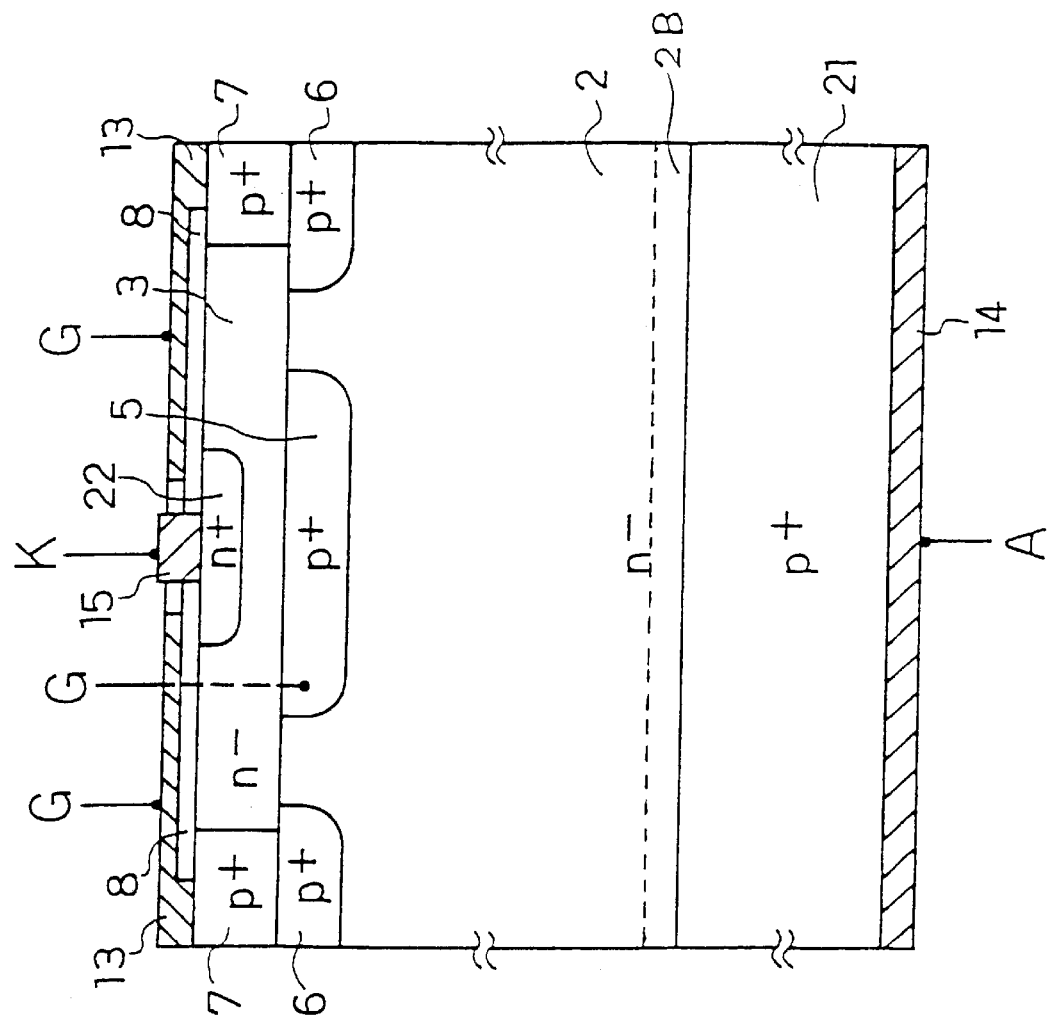
FIG. 6 is a cross-sectional view of a thyristor according to a sixth embodiment of the present invention;.

FIG. 6 is a cross-sectional view of a segment of an SiC thyristor according to the sixth embodiment of the present invention. In the figure, an n-type drift layer 2 of a low impurity density of $10^{14}$ to $10^{16}$ atm/cm³ is formed by a chemical vapor deposition method or the like, on a p-type SiC substrate,of a high impurity density of $10^{18}$ to $10^{20}$ atm/cm³ which functions as an anode region 21. In a manner similar to the case of the above-mentioned first embodiment, a p-type buried gate region 5 and a p-type buried gate contact region 6 are formed on the drift layer 2. In a similar manner, a p-type gate contact region 7, a channel region 3 and an n-type cathode region 22 are formed. A cathode electrode 15 is provided on the cathode region 22. A gate electrode 13 is provided on the channel region 3 via the insulating film 8. The end part of the gate electrode 13 contacts the gate contact region 7. An anode electrode 14 is provided on the anode region 21.

When the gate G and the cathode K are set to 0 V and a positive voltage is applied to the anode A, a depletion layer based on the built-in voltage expands in the junction part between the buried gate region 5 and the channel region 3 so as to bring the channel region 3 into the pinch off state. Thereby, a withstand voltage characteristics arises to withstand a forward direction voltage. When the gate G and the cathode K are set to 0 V and a negative voltage is applied to the anode A, a depletion layer expands to the junction part between the p+-type anode region 21 and the drift layer 2 so that the withstand voltage characteristics arises to withstand a reverse voltage. Therefore, a high withstand voltage both in the forward direction and in the reverse direction is attainable in the SiC thyristor according to the present embodiment. On the other hand, when a positive voltage is applied to the anode A, and a voltage of the built-in voltage or more with the reference to the cathode K is applied to the gate G, the thyristor part of the p+-type anode region 21, the n-type drift layer 2, the p+-type buried gate region 5 and the n+-type cathode region turns ON. Since holes are-injected into the drift layer 2 from the anode region 21, the conductivity modulation arises so that the ON-state resistance greatly reduces in the high current density region. In the case of a thyristor element of 5.3 kV of withstanding voltage, the ON-state resistance after the current rise can be made to be 10 mΩcm²or less.

In the present embodiment, by limiting the impurity.density of the p+-type anode region 21 in a range of $10^{16}$ to $10^{18}$ atm/cm³, or by providing an n-type high density region 2B between the p+-type anode region 21 and the n- drift region 2 as shown by a dotted line, the injection amount of holes from the p+-type anode region 21 is restricted, and thereby, the operation can be carried out as an IGBT. Though the ON-state resistance in this case is larger than the ON-state resistance of the thyristor of 10 mΩcm² and becomes approximately 40 mΩcm², there is an advantage that the switching speed is fast and the current can be turned on or off only by turning on or off the gate signal.

It is difficult to make the resistance low in the SiC p-type substrate of the initial material which becomes the anode region 21. Therefore, it is effective to make the p+-type anode region 21 thinner in order to further reduce the ON-state resistance (as described above, 10 mΩcm² in the thyristor, and 40 mΩcm² in the IGBT) between the anode 21 and the cathode 15. Though in the above-mentioned case, the thickness is approximately 80 to 200 μm, for example, by bringing the thickness into approximately 0.3 to 20 μm, the ON-state resistance of the thyristor or the IGBT can be greatly reduced in a range of approximately 1/10 (when it is 0.3 μm) to ½ (when it is 20 μm) without making the production excessively difficult. This case, for example, in the production method of embodiment 1, becomes possible by grinding or polishing the p+-type anode region 21 to the above-mentioned thickness before the drain electrode is formed. Furthermore, in the case that the p+-type anode region 21 is made to 1 μm or less, it is preferable to form a new p+-type region in the surface of the n-type drift region 2 by the ion implantation of aluminum, boron or the like after the anode region 21 is completely removed by grinding or polishing.

SEVENTH EMBODIMENT

Figure 7:
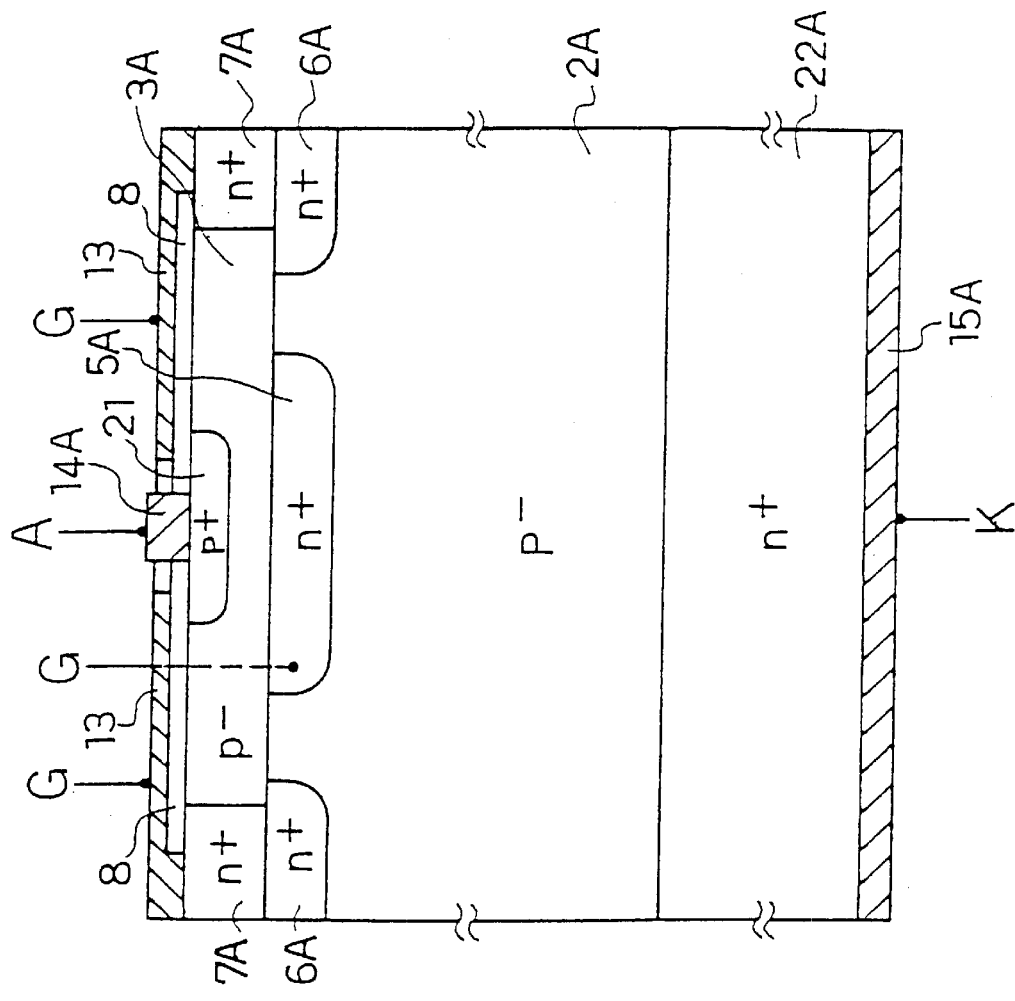
FIG. 7 is a cross-sectional view of a GTO according to a seventh embodiment of the present invention.
Figure 8:
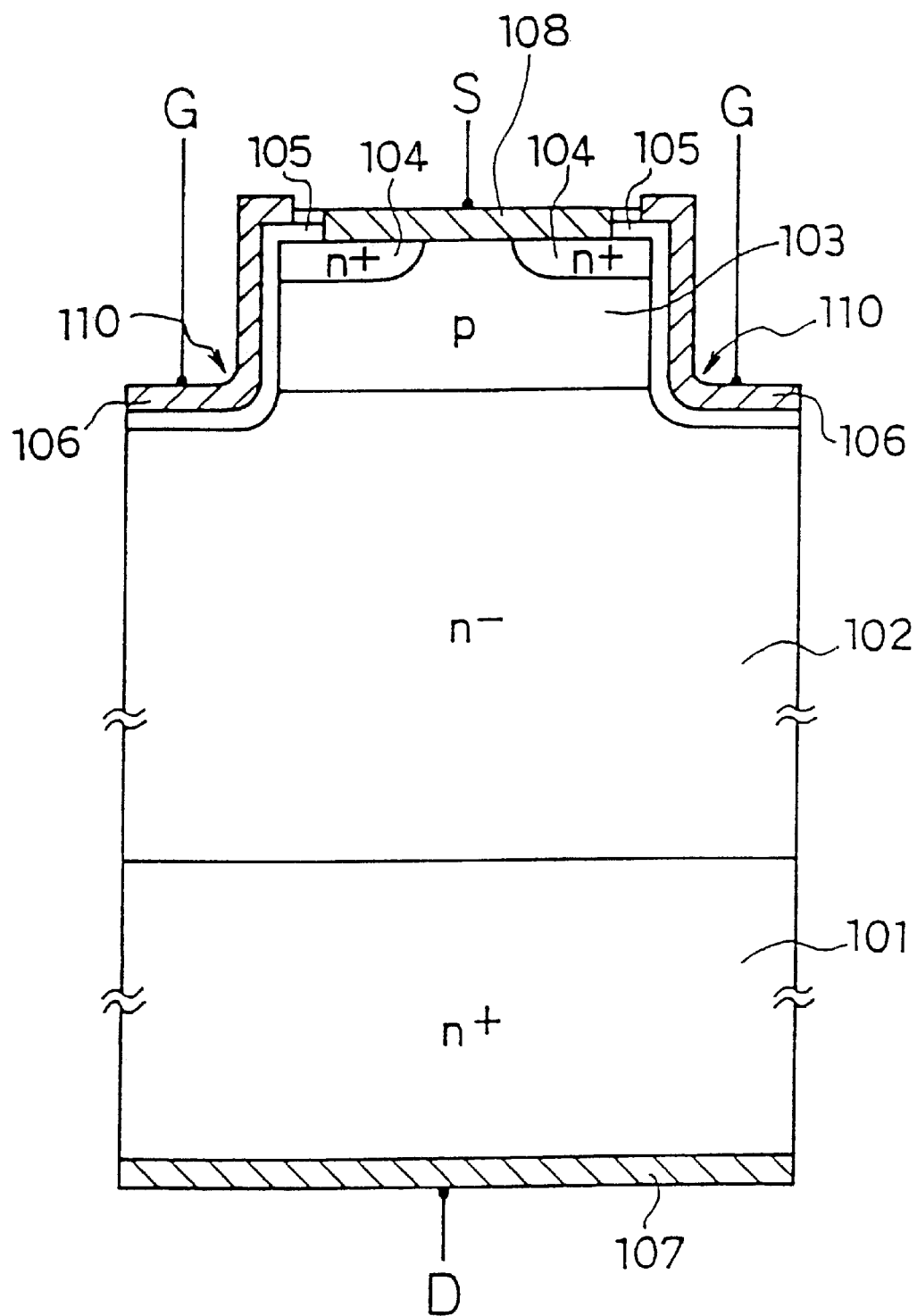
FIG. 8 is the cross-sectional view of the trench type field effect semiconductor device according to the prior art.
Figure 9:
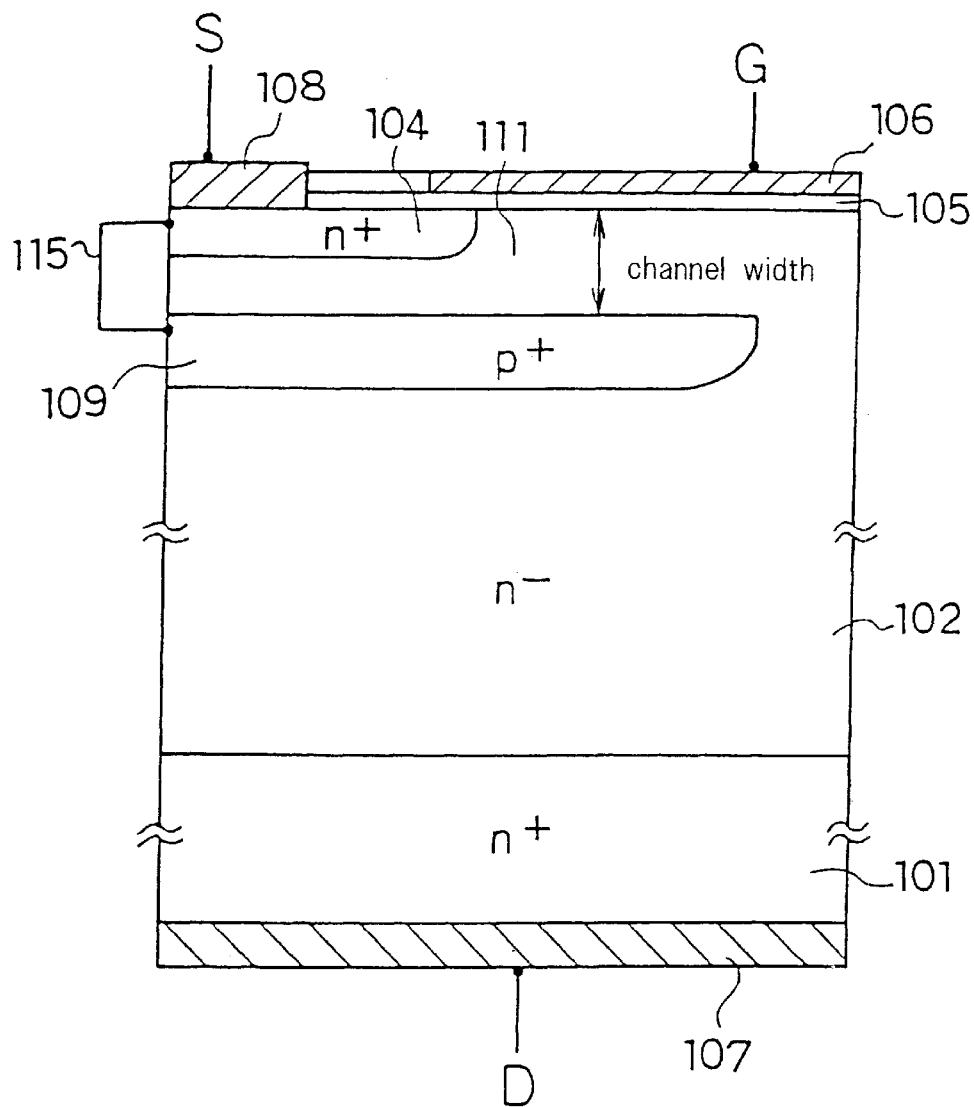
FIG. 9 is the cross-sectional view of the plane type field effect semiconductor device according to the prior art.

FIG. 7 is a cross-sectional view of a segment of a GTO thyristor (gate turn off thyristor) using SiC according to the seventh embodiment of the present invention. In the GTO thyristor using SiC of FIG. 7, n-type is changed to p-type and p-type is changed to n-type in each component of the SiC thyristor of FIG. 6. In FIG. 7, a cathode electrode 15A is provided on the cathode region 22A in the lower part, and an anode electrode 14A is provided on the anode region 21 in the upper part.

When the gate G and the anode A are set to 0 V and a negative voltage is applied to the cathode K, a depletion layer based on the built-in voltage expands in the vicinity of the junction part between the buried gate region 5 and the channel region 3 thereon, and the channel region 3 is made into a pinch off state. Thereby, the withstand voltage characteristic which withstands the forward direction voltage arises. When the gate G and the anode A are set to 0 V and a positive voltage is applied to the cathode K, a depletion layer expands in the vicinity of the junction part between the cathode region 22A and the drift layer 2, and the withstanding voltage characteristic which withstands the reverse direction voltage arises. Accordingly, the GTO thyristor using SiC of the present embodiment is capable of realizing a high withstand voltage both in the forward direction and in the reverse direction. On the other hand, when a negative voltage is applied to the cathode K and a voltage of the built-in voltage or less is applied to the gate G with reference to the anode A, the GTO thyristor turns ON. Since electrons are injected into the drift layer 2 from the cathode region 22, the conductivity modulation occurs and the ON-state resistance of a high current density region is greatly reduced. In the state that the GTO thyristor is turned on, by applying an inverse bias to the gate G and by extracting a part of the current flowing through the anode A and the cathode K from the gate G, the GTO thyristor can be made to OFF state.

EIGHTH EMBODIMENT

In the eighth embodiment of the present invention, with respect to the field effect transistors of the above-mentioned first to fifth embodiments and the SiC thyristors of the sixth and seventh embodiments, the buried gate region 5 is formed by the ion implantation of boron having a low ion activation ratio, and the buried gate contact region 6 is formed by the ion implantation of aluminum or the like having a high activation ratio. Since the ion activation ratio of the buried gate region 5 is low, almost no holes are injected from the buried gate region 5, but rather, holes are injected from the buried gate contact region 6 having the high activation ratio. Since these holes effectively modulate the conductivities of the channel region 3 and the drift layer 2, the further reduction of the ON-state resistance can be attained. The ON-state resistance can be reduced by approximately 10% in comparison with those of the above-mentioned first to seventh embodiments.

Though, eight embodiments are described in the above, the present invention covers a wider scope of application and derivative structures. For example, the basic element may be an IGBT, or the like. The MOS gate, the buried gate region and the buried gate contact region may be, respectively separated so as to form a configuration of individual gates as shown in the fourth embodiment, for example.

Though only the case of an element using SiC is described in each of the above-mentioned embodiments, the present invention can be applied to an element using other semiconductor materials such as silicon, gallium arsenide, or the like. In particular, it can be effectively applied to an element using a wide gap semiconductor material, such as diamond or gallium nitride.

In the above-mentioned first to sixth embodiments, though the description is made as to the case of an element of which the drift layer 2 of a low impurity density is the n-type, the structure of the present invention is applicable in the case of an element of which the drift layer is the p-type, by replacing n-type regions of other components with p-type regions and by replacing the p-type regions with n-type regions.

INDUSTRIAL APPLICABILITY

As is apparent from the description of each embodiment as mentioned above, in a field effect semiconductor device according to the present invention, a field effect transistor having a high withstand voltage in the normally off state and having a low ON-state resistance even in the case of a low gate voltage at the ON-state is realizable by providing with a second conductive type buried gate region, a second conductive type buried gate contact region, a second conductive type gate contact region and a MOS gate. Since the gate voltage may be low, the reliability of the gate insulating film is improved.

In the case that the gate is divided into a buried gate and a MOS gate, each gate can be controlled independently and the ON-state resistance can be further reduced.

By forming the second conductive type buried gate contact region of impurities of which the activation ratio is higher than that of the second conductive type buried gate region, the conductivity modulation is carried out effectively, and the ON-state resistance can be further reduced.

What is claimed is:

1. A field effect semiconductor device comprising:
   a drift region of a first conductive type of a low impurity density formed on a drain region of the first conductive type of a high impurity density,
   a drain electrode formed on the face of said drain region opposite to a face contacting to said drift region, a buried gate region of a second conductive type formed in a central region adjacent to the opposite face to a face contacting to said drain region, in said drift region;

a buried gate contact region of a second conductive type formed in an end part region adjacent to said opposite face of a face contacting to said drain region, in said drift region;

a gate contact region of a second conductive type formed on a part of said buried gate contact region;

a channel region of a first conductive type formed in a region surrounded by said opposite face of said drift region and said gate contact region;

a source region of a first conductive type formed in a central region adjacent to the surface of said channel region;

an insulating film formed on a part of the surface of said gate contact region, on the surface of said channel region and on a part of the surface of said source region;

a gate electrode provided on the surface of said insulating film and the surface of the gate contact region; and a source electrode provided on said source region.

2. A field effect semiconductor device in accordance with claim 1 characterized in that a gate contact region of the second conductive type for connecting said buried gate region and said buried gate contact region is formed in said drift layer of the first conductive type.

3. A field effect semiconductor device in accordance with claim 1 comprising a source electrode formed on the entire surface of said gate electrode via an insulating film and connected to said source region.

4. A field effect semiconductor device in accordance with claim 1 comprising a first gate electrode formed so as to contact said gate contact region and a second gate electrode which formed so as to oppose said channel region via said insulating film.

5. A field effect semiconductor device comprising:
a drift region of a first conductive type of a low impurity density formed on a region of a high impurity density;

a channel region of a first conductive type formed in a range broader than a buried gate region on said buried gate region;

a source region of a first conductive type formed in a central region adjacent to the surface of said channel region;

an insulating film formed on the surface of said drift region, on the side surfaces and on the surface of said channel region and on the surface of said source region;

a buried gate contact region of a second conductive type formed in an end region adjacent to said opposite face to the face contacting with said region of the high impurity density in said drift region;

a gate electrode formed on said insulating film and said buried gate contact region; and a source electrode formed on said source region.

6. A field effect semiconductor device comprising:
a drift region of a first conductive type of a low impurity density formed on an anode region of a second conductive type of a high impurity density;

an anode electrode formed on the face of said anode region opposite to the face contacting with said drift region;

a buried gate region of a second conductive type formed in a central region adjacent to the opposite face to the face contacting with said anode region in said drift region;

a buried gate contact region of a second conductive type formed in an end region adjacent to said opposite face of the face contacting with said drain region in said drift region; a gate contact region of a second conductive type formed on a part of said buried gate contact region;

a channel region of a first conductive type formed in a region surrounded by said opposite face of said drift region and said gate contact region;

a cathode region of a first conductive type formed in a central region adjacent to the surface of said channel region;

an insulating film formed on a part of the surface of said gate contact region, the surface of said channel region and the surface of said cathode region;

a gate electrode provided on the surface of said insulating film and the surface of said gate contact region; and a cathode electrode provided on said cathode region.

7. A field effect semiconductor device in accordance with claim 6 characterized in that a high density region of the first conductive type is formed between said anode region of the second conductive type and the drift region of the first conductive type.

8. A field effect semiconductor device comprising:
a drift region of a second conductive type of a low impurity density formed on a cathode region of a first conductive type of a high impurity density;

a cathode electrode formed on the face of said cathode region opposite to the face contacting with said drift region;

a buried gate region of a first conductive type formed in a central region adjacent to the opposite face to the face contacting with said cathode region in said drift region;

a buried gate contact region of a first conductive type formed in an end region adjacent to said opposite face to the face contacting with said cathode region in said drift region;

a gate contact region of a first conductive type formed on a part of said-buried gate contact region;

a channel region of a second conductive type formed in a region surrounded by said opposite face of said drift region and said gate contact region;

an anode region of a second conductive type formed in a central region adjacent to the surface of said channel region;

an insulating film formed on a part of the surface of said gate contact region, the surface of said channel region and the surface of said anode region;

a gate electrode provided on the surface of said insulating film and the surface of said gate contact region; and an anode electrode provided on said anode region.

9. A fabrication method of a field effect semiconductor device comprising:
the step of forming a drift region of a first conductive type of a low impurity density on a silicon carbide substrate of the first conductive type of a high impurity density;

the step of forming a drain electrode on the face of said drain region opposite to the face contacting with said drift region;

the step of forming a buried gate region of a second conductive type in a central region adjacent to the opposite face to the face contacting with said drain region within said drift region;

the step of forming-a buried gate contact region of a second conductive type in an end region adjacent to said opposite face to the face contacting with said drain region within said drift region;

the step of forming a gate contact region of a second conductive type on a part of said buried gate contact region;

the step of forming a channel region of a first conductive type in a region surrounded by said opposite face of said drift region and said gate contact region;

the step of forming a source region of a first conductive type in a central region adjacent to the surface of said channel region;

the step of forming an insulating film on a-part of the surface of said gate contact region, the surface of said channel region and the surface of said source region;

the step of forming a, gate electrode on the surface of said insulating film and the surface of the gate contact region; and the step of forming a source electrode on said source region.

10. A fabrication method of a field effect semiconductor device comprising:

the step of forming a drift region of a first conductive type of a low impurity density on a silicon carbide substrate serving as an anode region of a second conductive type of a high impurity density;

the step of forming an anode electrode on the face of said anode region opposite to the face contacting with said drift region;

the step of forming a buried gate region of a second conductive type in a central region adjacent to the opposite face to the face contacting with said anode region within said drift region;

the step of forming a buried gate contact region of a second conductive type in an end region adjacent to said opposite face to the face contacting with said drain, region within said drift region;

the step of forming a gate contact region of a second conductive type on a part of said buried gate contact region;

the step of forming a channel region of a first conductive type in a region surrounded by said opposite face of said drift region and said gate contact region;

the step of forming a cathode region of a first conductive type in a central region adjacent to the surface of said channel region;

the step of forming an insulating film on a part of the surface of said gate contact region, the surface of said channel region and the surface of said cathode region;

the step of forming a gate electrode on the surface of said insulating film and the surface of said gate contact region; and the step of forming a cathode electrode on said cathode region.

11. A fabrication method of a field effect semiconductor device in accordance with claim 10, further comprising the step of making the thickness of said anode region of the second conductive type thinner than the thickness of said drift region.

12. A fabrication method of a field effect semiconductor device in accordance with claim 10, further comprising:

the step of removing said anode region; and the step of forming the region of the second conductive type by ion implantation in the drift region in which said anode region is removed.

13. A fabrication method of a field effect semiconductor device comprising:

the step of forming a drift region of a second conductive type of a low impurity density on a silicon carbide substrate of a first conductive type of a high impurity density;

the step of forming a cathode electrode on the surface of said cathode region opposite to the face contacting with said drift region;

the step of forming a buried gate region of a first conductive type in a central region adjacent to the opposite face to the face contacting with said cathode region within said drift region;

the step of forming a buried gate contact region of a first conductive type in an end region adjacent to said opposite face to the face contacting with said cathode region within said drift region;

the step of forming a gate contact region of a first conductive type on a part of said buried gate contact region;

the step of forming a channel region of a second conductive type in a region surrounded by said opposite face of said drift region and said gate contact region;

the step of forming an anode region of a second conductive type in a central region adjacent to the surface of said channel region;

the step of forming an insulating film on a part of the surface of said gate contact region, the surface of said channel region and the surface of said anode region;

the step of forming a gate electrode on the surface of said insulating film and the surface of said gate contact region; and the step of forming an anode electrode on said anode region.

* * * * *